(12) United States Patent
Chen et al.

(10) Patent No.: US 10,770,394 B2
(45) Date of Patent: Sep. 8, 2020

(54) FAN-OUT SEMICONDUCTOR PACKAGING STRUCTURE WITH ANTENNA MODULE AND METHOD MAKING THE SAME

(71) Applicant: SJ Semiconductor (Jiangyin) Corporation, Jiangyin (CN)

(72) Inventors: Yenheng Chen, Jiangyin (CN); Chengtar Wu, Jiangyin (CN); Jangshen Lin, Jiangyin (CN); Chengchung Lin, Jiangyin (CN)

(73) Assignee: SJ SEMICONDUCTOR (JIANGYIN) CORPORATION, Jiang Yin (CN)

( * ) Notice: Subject to any disclaimer, the term of this patent is extended or adjusted under 35 U.S.C. 154(b) by 0 days.

(21) Appl. No.: 16/212,487

(22) Filed: Dec. 6, 2018

(65) Prior Publication Data

US 2019/0181085 A1  Jun. 13, 2019

(30) Foreign Application Priority Data

Dec. 7, 2017  (CN) .......................... 2017 1 1282005
Dec. 7, 2017  (CN) ..................... 2017 2 1686212 U

(51) Int. Cl.
*H01L 23/528* (2006.01)
*H01L 23/00* (2006.01)
(Continued)

(52) U.S. Cl.
CPC .......... *H01L 23/528* (2013.01); *H01L 21/568* (2013.01); *H01L 23/293* (2013.01);
(Continued)

(58) Field of Classification Search
CPC . H01L 23/528; H01L 23/49822; H01L 24/19; H01L 23/49827; H01L 23/5389;
(Continued)

(56) References Cited

U.S. PATENT DOCUMENTS

| 2014/0073087 A1* | 3/2014 | Huang | H01L 25/50 438/107 |
| 2015/0016078 A1* | 1/2015 | Yang | H05K 1/024 361/762 |
| 2015/0262931 A1* | 9/2015 | Vincent | H01L 21/76838 257/773 |

(Continued)

*Primary Examiner* — Fernando L Toledo
*Assistant Examiner* — Adam S Bowen
(74) *Attorney, Agent, or Firm* — Alston & Bird LLP

(57) ABSTRACT

The present application provides a fan-out semiconductor packaging structure with an antenna module and a method making the same. The fan-out semiconductor packaging structure with the antenna module comprises: a semiconductor chip; a plastic packaging material layer enclosing a periphery of the semiconductor chip; a filling structure disposed in the plastic packaging material layer and disposed on the periphery of the semiconductor chip, a loss caused by the filling structure to an antenna signal is smaller than a loss caused by the plastic packaging material layer to an antenna signal; an antenna module disposed on the first surface of the plastic packaging material layer, an orthographic projection of the antenna module on the filling structure is disposed on the filling structure; a redistribution layer disposed on the second surface of the plastic packaging material layer; and a solder bump disposed on a surface of the redistribution layer.

15 Claims, 8 Drawing Sheets

(51) Int. Cl.
*H01L 21/56* (2006.01)
*H01L 23/29* (2006.01)
*H01L 23/538* (2006.01)
*H01L 23/498* (2006.01)

(52) U.S. Cl.
CPC .. *H01L 23/49822* (2013.01); *H01L 23/49827* (2013.01); *H01L 23/5389* (2013.01); *H01L 24/09* (2013.01); *H01L 24/17* (2013.01); *H01L 24/19* (2013.01); *H01L 24/20* (2013.01); H01L 23/49816 (2013.01); H01L 2223/6677 (2013.01); H01L 2224/0231 (2013.01); H01L 2224/02333 (2013.01); H01L 2224/02379 (2013.01); H01L 2224/96 (2013.01); H01L 2924/1421 (2013.01); H01L 2924/18162 (2013.01)

(58) Field of Classification Search
CPC ..... H01L 24/20; H01L 23/293; H01L 21/568; H01L 24/17; H01L 24/09; H01L 2924/18162; H01L 2224/96; H01L 23/49816; H01L 2223/6677; H01L 2224/02333; H01L 2224/0231; H01L 2224/02379; H01L 2924/1421; H01L 23/66; H01L 23/16; H01L 23/3128
USPC .......................................................... 257/678
See application file for complete search history.

(56) References Cited

U.S. PATENT DOCUMENTS

2019/0057943 A1\* 2/2019 Kim .................. H01L 23/66
2019/0096840 A1\* 3/2019 Ang .................. H01L 24/96

\* cited by examiner

FAN-OUT SEMICONDUCTOR PACKAGING STRUCTURE WITH ANTENNA MODULE AND METHOD MAKING THE SAME

CROSS REFERENCES TO RELATED APPLICATIONS

This application claims the benefits of priority to Chinese Patent Application No. CN2017112820058, entitled "Fan-Out Semiconductor Packaging Structure With an Antenna and Method Making the Same", filed with SIPO on Dec. 7, 2017, and Chinese Patent Application No. CN 2017216862125, entitled "Fan-Out Semiconductor Packaging Structure With an Antenna", filed with SIPO on Dec. 7, 2017, the contents of which are incorporated herein by reference in its entirety.

TECHNICAL FIELD

The present application relates to the technical field of semiconductors, in particular to a fan-out semiconductor packaging structure with an antenna module.

BACKGROUND

To achieve better communication effect, radio frequency chips are generally provided with antennas during use. A fan-out wafer level packaging method of the radio frequency chips generally comprises the following steps: providing a carrier and forming an adhesive layer on a surface of the carrier; photo-etching and electroplating on the adhesive layer to obtain a redistribution layer (RDL); mounting the radio frequency chip on the redistribution layer by adopting a chip bonding process; packaging the chip in a plastic packaging material layer by adopting an injection molding process; forming an antenna on the surface of the plastic packaging material layer; removing the carrier and the adhesive layer; photo-etching and electroplating on the redistribution layer to form an Under-Bump Metal (UBM) layer; performing ball placement and reflow on the UBM layer to form a solder ball bump; and then performing wafer bonding and dicing. Accordingly, in the existing radio frequency chip packaging structure, the radio frequency chip is packaged in the plastic packaging material layer, and the antenna is fabricated on the surface of the plastic packaging material layer and used in conjunction with the radio frequency chip. However, the packaging structure has the following problems: since the plastic packaging material layer is disposed below the antenna, the plastic packaging material layer will cause a greater loss to the antenna signals, thus influencing the performance of the structure.

SUMMARY

The present application provides a fan-out semiconductor packaging structure with an antenna module, comprising: a semiconductor chip; a plastic packaging material layer comprising a first surface and a second surface opposite to the first surface, wherein the plastic packaging material layer is patterned to enclose a periphery of the semiconductor chip and exposes a front surface of the semiconductor chip; a filling structure patterned inside the plastic packaging material layer and disposed on the periphery of the semiconductor chip, wherein the filling structure is made of a material matching an antenna signal better than a material of the plastic packaging later, such that a loss caused by the filling structure to the antenna signal is smaller than a loss caused by the plastic packaging material layer to the antenna signal; an antenna module disposed on the first surface of the plastic packaging material layer, wherein an orthographic projection of the antenna module on the filling structure is disposed on the filling structure; a redistribution layer disposed on the second surface of the plastic packaging material layer, and electrically connecting with the semiconductor chip; and a solder bump disposed on a surface of the redistribution layer, and electrically connecting with the redistribution layer.

Preferably, the semiconductor chip is unpackaged comprises a contact pad disposed on the front surface of the semiconductor chip connecting electrically with the unpackaged chip.

Preferably, the filling structure comprises a glass filling structure, a silicon filling structure, a Roger 5880 filling structure, a polymer material filling structure or a composite material filling structure.

Preferably, the filling structure is a ring structure, wherein the filling structure surrounds the periphery of the semiconductor chip, and has a space from the semiconductor chip.

Preferably, the antenna module comprises a plurality of antenna units, wherein the plurality of antenna units are arranged with a space from each other along a circumferential direction of the filling structure on the first surface of the plastic packaging material layer.

Preferably, the plurality of antenna units each is a block antenna or a spiral antenna.

Preferably, the antenna module comprises a spiral antenna surrounding a circumferential direction of the filling structure.

Preferably, the fan-out semiconductor packaging structure with the antenna module further comprises an interconnecting structure, wherein the interconnecting structure is disposed between the antenna module and the redistribution layer, and is electrically connected with the antenna module and the redistribution layer.

Preferably, the redistribution layer comprises: an insulating layer disposed on the second surface of the plastic packaging material layer; at least one metal wire layer disposed in the insulating layer; and an under-bump metal layer disposed on a surface of the insulating layer, and electrically connecting with the metal wire layer.

The present application further provides a method for fabricating a fan-out semiconductor packaging structure with an antenna module, comprising the following steps: 1) providing a carrier and forming a peeling layer on a top surface of the carrier; 2) providing a semiconductor chip and mounting the semiconductor chip on a surface of the peeling layer with a front surface facing downward; 3) providing a filling structure and mounting the filling structure on the surface of the peeling layer, wherein the filling structure is disposed on a periphery of the semiconductor chip; 4) forming a plastic packaging material layer on the surface of the peeling layer, wherein the plastic packaging material layer encloses the semiconductor chip and the filling structure; wherein the plastic packaging material layer comprises a first surface and a second surface opposite to the first surface, and the second surface of the plastic packaging material layer is in contact with the peeling layer; and wherein a material of the filling structure matches a antenna signal better than the plastic packaging material does such that a loss caused by the filling structure to the antenna signal is smaller than a loss caused by the plastic packaging material layer to the antenna signal; 5) removing the carrier and the peeling layer; 6) forming a redistribution layer on the second surface of the plastic packaging material layer, wherein the redistribution layer is electrically connected with the semiconductor chip; 7) forming an antenna module on the first surface of the plastic packaging material layer, wherein an orthographic projection of the antenna module on the filling structure is disposed on the filling structure; and 8) forming a solder ball bump on a surface of the redistribution layer, wherein the solder ball bump is electrically connected with the redistribution layer.

Preferably, the filling structure provided in step 3) comprises a glass filling structure, a silicon filling structure, a Roger 5880 filling structure, a polymer material filling structure or a composite material filling structure.

Preferably, the filling structure provided in step 3) is a ring structure, wherein the filling structure surrounds the periphery of the semiconductor chip, and has a space from the semiconductor chip.

Preferably, in step 7), forming the antenna module on the first surface of the plastic packaging material layer comprises: forming a plurality of antenna units arranged with a space from each other along a circumferential direction of the filling structure on the first surface of the plastic packaging material layer, wherein the plurality of antenna units are jointly used as the antenna module, wherein the antenna units comprise block antennas or spiral antennas.

Preferably, in step 7), forming the antenna module on the first surface of the plastic packaging material layer comprises: forming a spiral antenna surrounding a circumferential direction of the filling structure on the first surface of the plastic packaging material layer as the antenna module.

Preferably, the method further comprises the following step between step 6) and step 7): forming an interconnecting structure running through the filling structure and the plastic packaging material layer in the filling structure, wherein the interconnecting structure is electrically connected with the redistribution layer; and wherein the antenna formed in step 7) is electrically connected with the interconnecting structure. As described above, the fan-out semiconductor packaging structure with the antenna module and the method making the same provided by the present application have the following beneficial effects: the fan-out semiconductor packaging structure with the antenna module according to the present application provides the filling structure in the plastic packaging material layer below the antenna module, the loss caused by the filling structure to the antenna signals is smaller than the loss caused by the plastic packaging material layer to the antenna signals, which can effectively reduce the loss to the antenna signals, thus significantly improving the performance of the device.

DESCRIPTION OF COMPONENT REFERENCE SIGNS

Figure 1:
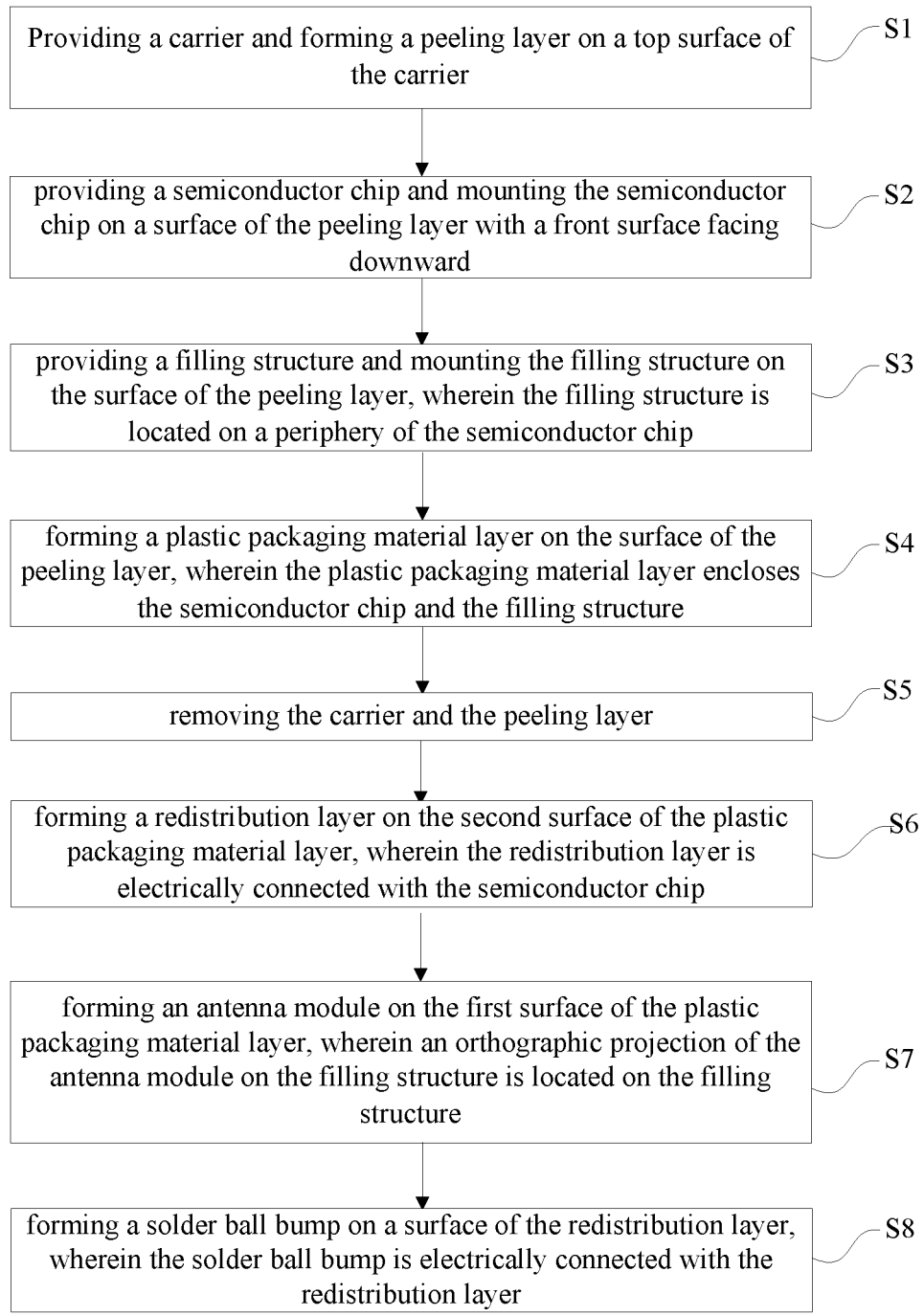
FIG. 1 illustrates a flowchart of a method for fabricating a fan-out semiconductor packaging structure with an antenna module according to embodiment 1 of the present disclosure.

10 Carrier
11 Peeling layer
12 Semiconductor chip
121 Unpacked chip
122 Contact pad
13 Filling structure
14 Plastic packaging material layer
15 Redistribution layer
151 Insulating layer
152 Metal wire layer
153 Under-bump metal layer
16 Antenna module
161 Antenna unit
17 Solder ball bump
18 Interconnecting structure

DETAILED DESCRIPTION OF THE PREFERRED EMBODIMENTS

The implementation modes of the present application will be described below through specific examples. One skilled in the art can easily understand other advantages and effects of the present application according to contents disclosed in this specification. The present application may also be implemented or applied through other different implementation modes, and various modifications or changes may be made to all details in this specification based on different points of view and applications without departing from the spirit of the present application.

It needs to be stated that the drawings provided in this embodiment are just used for schematically describing the basic concept of the present application, thus only illustrate components only related to the present application and are not drawn according to the numbers, shapes and sizes of components during actual implementation, the configuration, number and scale of each component during actual implementation thereof may be freely changed, and the component layout configuration thereof may be more complex.

Embodiment 1

Referring to FIG. 1, this embodiment provides a method for fabricating a fan-out semiconductor packaging structure with an antenna module, comprising the following steps:
1) providing a carrier and forming a peeling layer on a top surface of the carrier;
2) providing a semiconductor chip and mounting the semiconductor chip on a surface of the peeling layer with a front surface facing downward;
3) providing a filling structure and mounting the filling structure on the surface of the peeling layer, wherein the filling structure is disposed on a periphery of the semiconductor chip;
4) forming a plastic packaging material layer on the surface of the peeling layer, wherein the plastic packaging material layer encloses the semiconductor chip and the filling structure; wherein the plastic packaging material layer comprises a first surface and a second surface opposite to the first surface, and the second surface of the plastic packaging material layer is in contact with the peeling layer; and wherein a loss caused by the filling structure to an antenna signal is smaller than a loss caused by the plastic packaging material layer to an antenna signal;
5) removing the carrier and the peeling layer;
6) forming a redistribution layer on the second surface of the plastic packaging material layer, wherein the redistribution layer is electrically connected with the semiconductor chip;

7) forming an antenna module on the first surface of the plastic packaging material layer, wherein an orthographic projection of the antenna module on the filling structure is inside the filling structure; and 8) forming a solder ball bump on a surface of the redistribution layer, wherein the solder ball bump is electrically connected with the redistribution layer.

Figure 2:
FIGS. 2 to 12 illustrate cross sectional views after each step of fabricating the fan-out semiconductor packaging structure with an antenna module according to embodiment 1 of the present disclosure.
Figure 3:
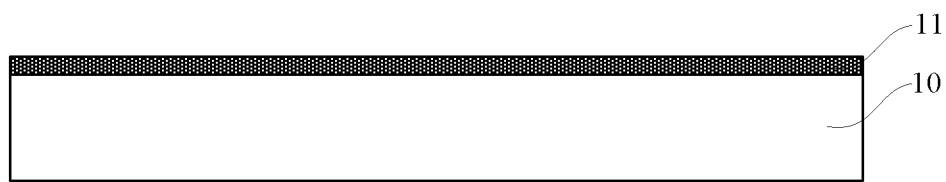

In step 1), referring to step S1 in FIG. 1, and the cross section structures in FIG. 2 and FIG. 3, a carrier 10 is provided, and a peeling layer 11 is provided on a top surface of the carrier 10.

As an example, as illustrated in FIG. 2, the material of the carrier 10 may be, but not limited to, silicon, glass, silicon oxide, ceramics, polymer, metal, or a combination thereof. The carrier 101 is built on a wafer, a glass blank, or other substrate of a desired shape. In this embodiment, the semiconductor chip is protected by the carrier 10 from being ruptured, warped or broken in the subsequent fabrication processes.

As an example, as illustrated in FIG. 3, the peeling layer 11 acts as a separation buffer layer between the subsequently formed semiconductor chip 12, the filling structure 13 and the plastic packaging material layer 14, and the carrier 10 in a subsequent process. The peeling layer 11 is preferably made of an adhesive material with a smooth surface, and it must have a certain binding force with the semiconductor chip 12, the filling structure 13 and the plastic packaging material layer 14 to guarantee that the semiconductor chip 12, the filling structure 13 and the plastic packaging material layer 14 will not move in the subsequent process. In addition, the peeling layer 11 also has a strong binding force with the carrier 10. Generally speaking, the binding force of the peeling layer 11 with the carrier 10 is greater than the binding force of the peeling layer 11 with the semiconductor chip 12, the filling structure 13 and the plastic packaging material layer 14. As an example, the material of the peeling layer 11 may be, for example, an adhesive tape with both sides having viscosity or adhesive made through a spin-coating process, etc. The adhesive tape is preferably a UV tape, which is easily torn off after exposure to UV light. In other implementation modes, the peeling layer 11 may be other material layers formed through physical vapor deposition or chemical vapor deposition, such as epoxy, silicone rubber, polyimide (PI), polybenzoxazole (PBO), benzocyclobutene (BCB), etc. When the carrier 10 is subsequently separated, the peeling layer 11 can be removed by means of wet etching, chemical mechanical polishing, tearing, etc.

Figure 4:
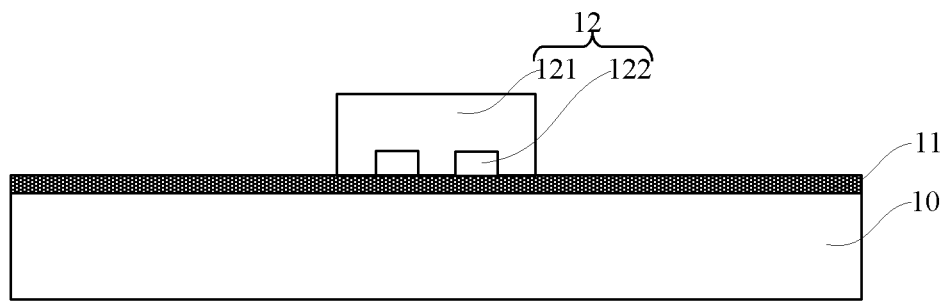

In step 2), referring to step S2 in FIG. 1 and FIG. 4, a semiconductor chip 12 is provided and the semiconductor chip 12 is mounted on a surface of the peeling layer 11 with a front surface facing downward.

As an example, the semiconductor chip 12 may be any one of chips, such as a radio frequency chip, etc. The semiconductor chip 12 comprises an unpacked chip 121 and a contact pad 122, wherein the contact pad 122 is disposed on the unpacked chip 121 and is electrically connected with functional devices in the unpacked chip 121; and a surface where the contact pad 122 is placed is the front surface of the semiconductor chip 12.

It needs to be noted that the semiconductor chip 12 may be any one of existing radio frequency communication chips for transmitting and receiving communication information. The thickness of the semiconductor chip 12 may be set according to actual needs. Preferably, in this embodiment, the thickness of the semiconductor chip 12 may be, but not limited to, 100 μm-200 μm.

As an example, the number of the semiconductor chips 12 may be set according to actual needs, and the number of the semiconductor chips 12 mounted on the peeling layer 11 may be one, two or more.

Figure 5:
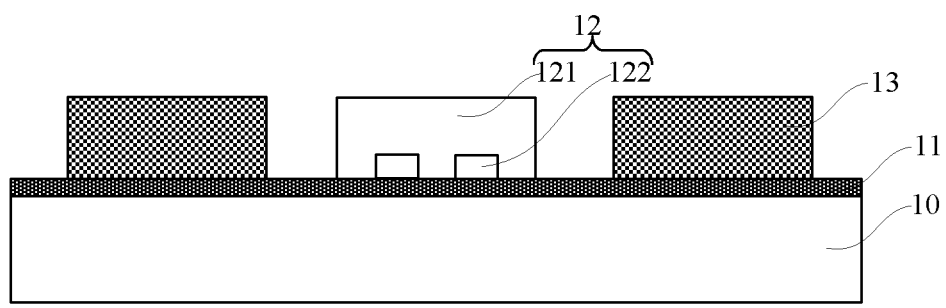

In step 3), referring to step S3 in FIG. 1 and the structure in FIG. 5, a filling structure 13 is provided and the filling structure 13 is disposed on the surface of the peeling layer 11, wherein the filling structure 13 is disposed on a periphery of the semiconductor chip 12.

As an example, the filling structure 13 may be a glass filling structure, a silicon filling structure, a Roger 5880 filling structure, a polymer material filling structure or a composite material filling structure, i.e., the material of the filling structure 13 may be glass, silicon, Roger 5880, polymer materials or composite materials, etc.

As an example, the shape of the filling structure 13 may be set according to actual needs. Preferably, in this embodiment, the filling structure 13 may be a rectangular ring structure, the filling structure 13 surrounds the periphery of the semiconductor chip 12. The filling structure 13 may be attached to the sidewall of the semiconductor chip 12, or has a space with the semiconductor chip 12, and preferably, in this embodiment, the filling structure 13 has a space with the semiconductor chip 12.

As an example, when the filling structure 13 is a ring structure, the filling structure 13 may be a circular ring structure, a rectangular ring structure or the like.

It needs to be noted that, when the filling structure 13 is a ring structure, the filling structure 13 may be a continuous ring structure or may be a ring structure comprising a plurality of filling units which are arranged with a space from each other.

As an example, the height of the filling structure 13 may be the same as the height of the semiconductor chip 12, may be smaller than the height of the semiconductor chip 12, or may also be greater than the height of the semiconductor chip 12, i.e., the top surface of the filling structure 13 may be leveled with the top surface of the semiconductor chip 12, may be lower than the top surface of the semiconductor chip 12, or may also be higher than the top surface of the semiconductor chip 12. FIG. 5 illustrates an example that the height of the filling structure 13 is the same as that of the semiconductor chip 12.

Figure 6:
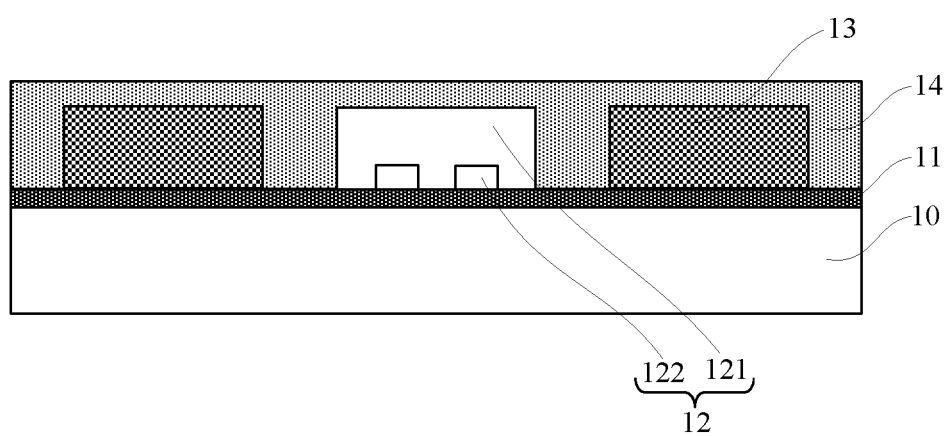

In step 4), referring to step S4 in FIG. 1 and FIG. 6, a plastic packaging material layer 14 is formed on the surface of the peeling layer 11, wherein the plastic packaging material layer 14 encloses the semiconductor chip 12 and the filling structure 13; the plastic packaging material layer 14 comprises a first surface and a second surface opposite to the first surface, and the second surface of the plastic packaging material layer 14 is in contact with the peeling layer 11; typically the filling structure 13 is made of a material which has a better matching RF index than the antenna signal, therefore loss to antenna signals caused by the filling structure 13 is smaller than a loss to antenna signals caused by the plastic packaging material layer 14.

As an example, the plastic packaging material layer 14 may be formed on the top surface of the peeling layer 11 by adopting a process of compression molding, transfer molding, liquid seal molding, molding underfill, capillary underfill, vacuum laminating or spin coating. Preferably, in this embodiment, the plastic packaging material layer 14 is formed on the top surface of the peeling layer 11 by adopting the molding underfill process.

As an example, the material of the plastic packaging material layer 14 may be, but not limited to, a polyimide layer, a silica gel layer, an epoxy resin layer, a curable polymer-based material layer, or a curable resin-based material layer.

In one example, as illustrated in FIG. 6, the plastic packaging material layer 14 formed on the top surface of the peeling layer 11 encloses the semiconductor chip 12 and the filling structure 13, i.e., the first surface of the plastic packaging material layer 14 is higher than the back surface of the semiconductor chip 12 and the top surface of the filling structure 13.

In another example, the plastic packaging material layer 14 may also be formed according to the height of the semiconductor chip 12 or/and the filling structure 13 such that the height of the plastic packaging material layer 14 formed is the same as the height of the semiconductor chip 12 or/and the height of the filling structure 13, i.e., the first surface of the plastic packaging material layer 14 is enabled to be leveled with the back surface of the semiconductor chip 12 or/and the top surface of the filling structure 13.

Figure 7:
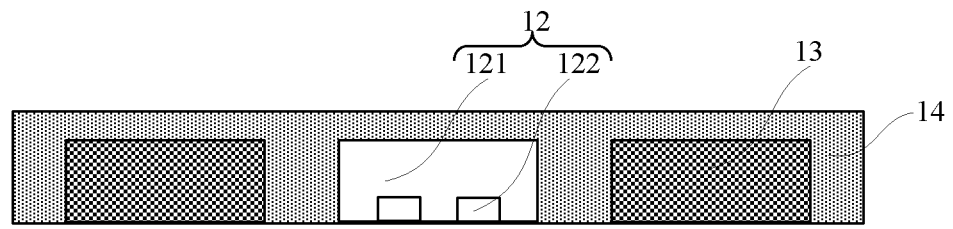

In step 5), referring to step S5 in FIG. 1 and FIG. 7, the carrier 10 and the peeling layer 11 are removed.

As an example, the carrier 10 and the peeling layer 11 may be removed by adopting a grinding process, a thinning process, etc. Preferably, in this embodiment, the carrier 10 is removed by tearing off the peeling layer 11.

Figure 8:
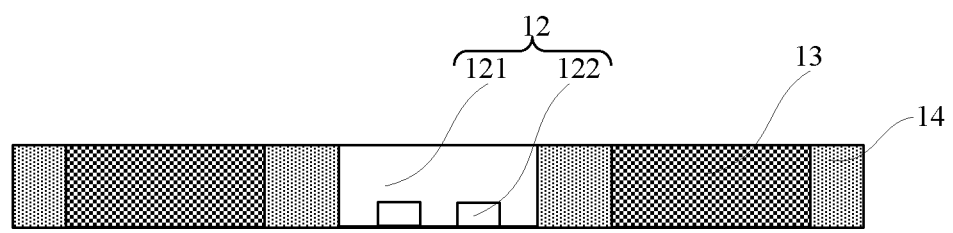

As an example, when the top surface of the plastic packaging material layer 14 is higher than the back surface of the semiconductor chip 12 and the top surface of the filling structure 13 illustrated in FIGS. 6 and 7, as illustrated in FIG. 8, after step 5), the method further comprises a step of thinning and grinding the first surface of the plastic packaging material layer 14 such that the first surface of the plastic packaging material layer 14 is leveled with the back surface of the semiconductor chip 12 or/and the top surface of the filling structure 13. Specifically, the first surface of the plastic packaging material layer 14 may be thinned and ground by adopting a chemical mechanical polishing (CMP) process.

Of course, the step of thinning and grinding the first surface of the plastic packaging material layer 14 may also be performed between step 4) and step 5), i.e., the step of thinning and grinding the first surface of the plastic packaging material layer 14 is executed before removing the carrier 10 and the peeling layer 11.

Figure 9:
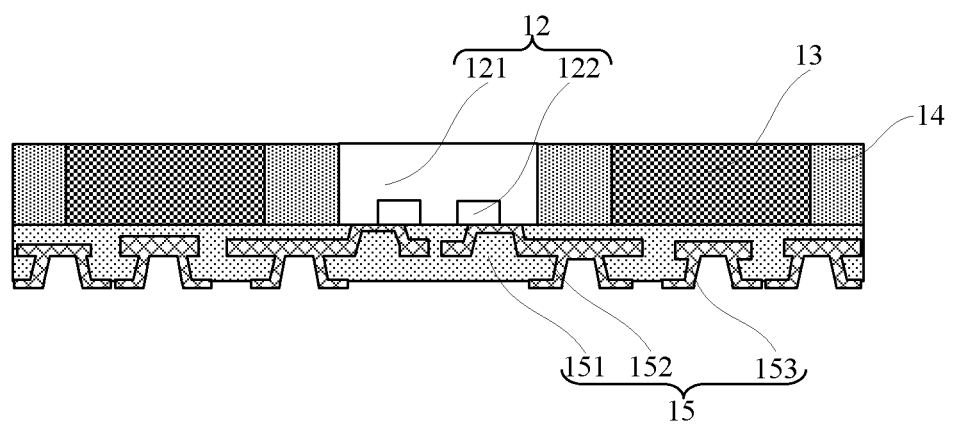

In step 6), referring to step S6 in FIG. 1 and FIG. 9, a redistribution layer 15 is formed on the second surface of the plastic packaging material layer 14, wherein the redistribution layer 15 is electrically connected with the semiconductor chip 12.

As an example, as illustrated in FIG. 9, the redistribution layer 15 comprises an insulating layer 151, at least one insulating layer 151 and an under-bump metal layer 153, and forming the redistribution layer 15 on the second surface of the plastic packaging material layer 14 comprises the following steps:

6-1) forming the metal wire layer 152 on the second surface of the plastic packaging material layer 14, wherein the metal wire layer 152 is electrically connected with the semiconductor chip 12;

6-2) forming the insulating layer 151 on the second surface of the plastic packaging material layer 14, wherein the insulating layer 151 encloses the metal wire layer 152, and the top surface of the insulating layer 151 is higher than the top surface of the metal wire layer 152;

6-3) forming an opening in the insulating layer 151, wherein the opening exposes the metal wire layer 152; and 6-4) forming the under-bump metal layer 153 in the opening.

In another example, as illustrated in FIG. 9, the redistribution layer 15 comprises a metal wire layer 152, at least one insulating layer 151, and an under-bump metal layer 153, and forming the redistribution layer 15 on the second surface of the plastic packaging material layer 14 comprises the following steps:

6-1) forming a first insulating layer 151 on the second surface of the plastic packaging material layer 14;

6-2) forming a first opening in the first insulating layer 151, wherein the first opening exposes part of the contact pad 122 of the semiconductor chip 12;

6-3) forming the metal wire layer 152 in the first opening;

6-4) forming a second insulating layer 151 on the top surface of the first insulating layer 151;

6-5) forming a second opening in the second insulating layer 151, wherein the second opening exposes the metal wire layer 152; and 6-6) forming the under-bump metal layer 153 in the second opening.

As an example, in the above-mentioned example, the material of the metal wire layer 152 may be, but not limited to, a combination of copper, aluminum, nickel, gold, silver and titanium, and the metal wire layer 152 may be formed by adopting a process such as PVD, CVD, sputtering, electroplating or electroless plating. The material of the insulating layer 121 may be a low k dielectric material. Specifically, the material of the insulating layer 151 may be one of epoxy resin, silica gel, PI, PBO, BCB, silicon oxide, phosphorosilicate glass and fluorine-containing glass, and the insulating layer 151 may be formed by adopting processes such as spin coating, CVD or plasma enhanced CVD.

Figure 10:
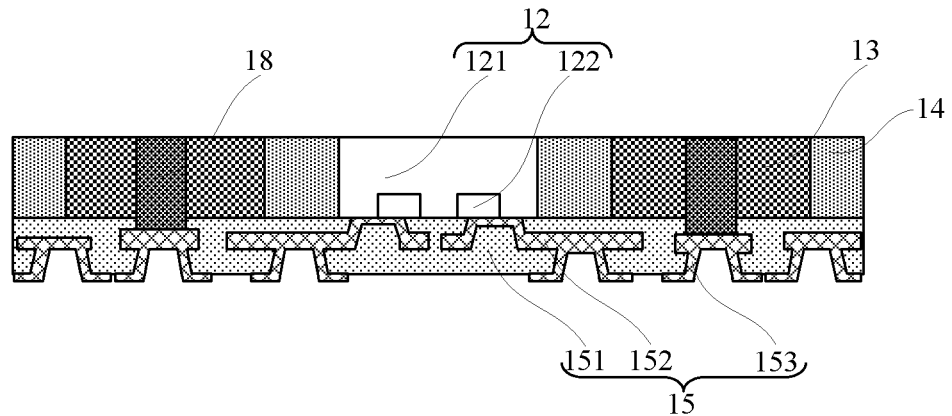

As an example, as illustrated in FIG. 10, after step 6), the step may further comprise the following step: forming an interconnecting structure 18 running through the filling structure 13 and the plastic packaging material layer 14 in the filling structure 13, wherein the interconnecting structure 18 is electrically connected with the redistribution layer 15; and specifically, the interconnecting structure 18 is electrically connected with the metal wire layer 152 in the redistribution layer 15. The material of the interconnecting structure 18 may be, but not limited to, copper, aluminum, nickel, gold, silver, titanium or a combination thereof.

Figure 11:
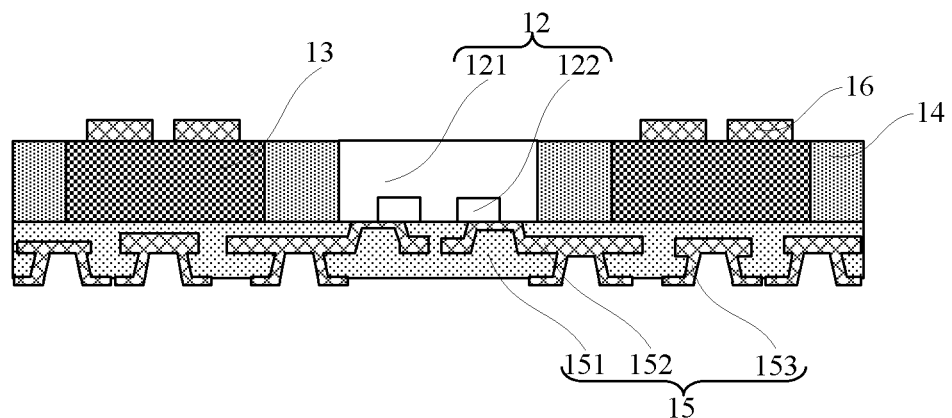
Figure 12:
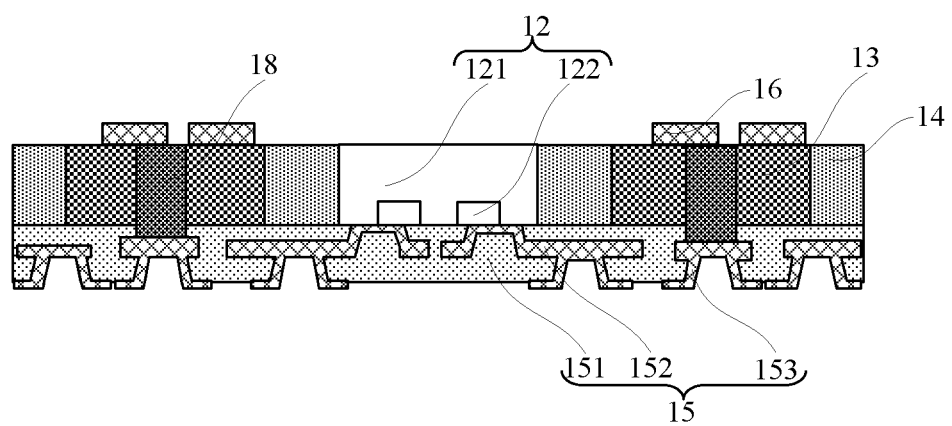

In step 7), referring to step S7 in FIG. 1 and the structures in FIGS. 11 to 15, here FIG. 11 illustrates an example that interconnecting structure 18 has not formed, and FIG. 12 illustrates an example that the interconnecting structure 18 has formed, an antenna module 16 is formed on the first surface of the plastic packaging material layer 14, wherein an orthographic projection of the antenna module 16 on the filling structure 13 is inside the filling structure 13.

Figure 13:
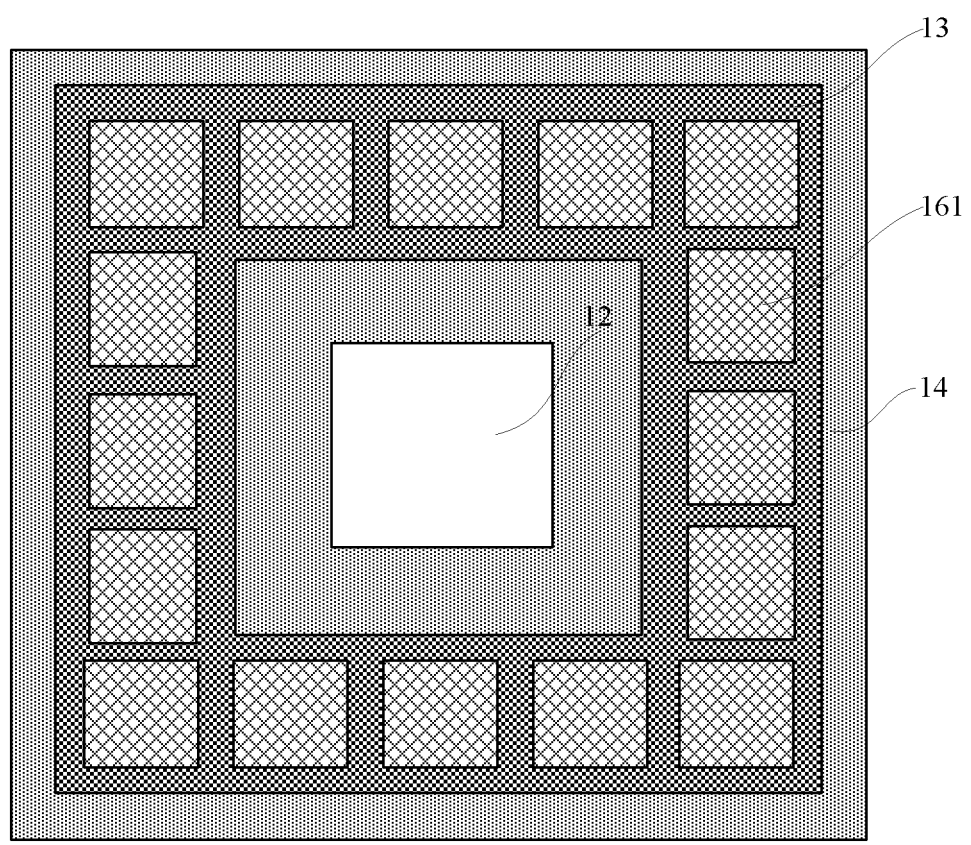
FIGS. 13-15 illustrate top views of exemplary antenna structures according to embodiments of the present disclosure.
Figure 14:
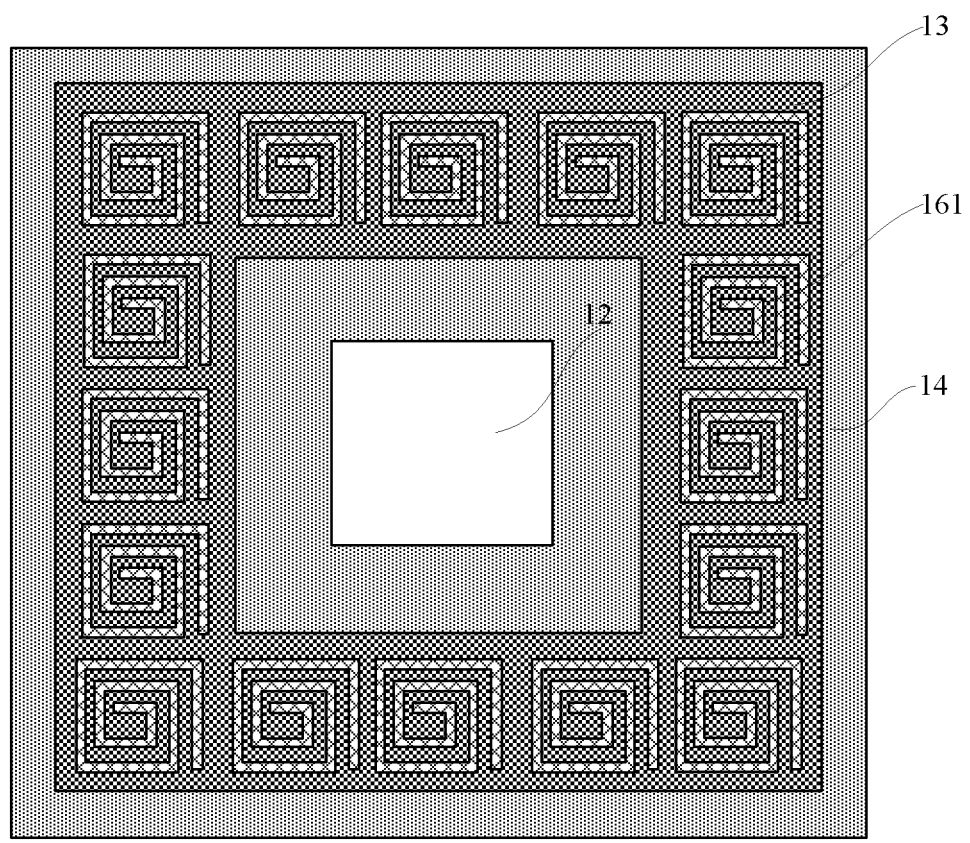

In one example, FIG. 13 and FIG. 14 illustrate top views of the structures in FIG. 11 and FIG. 12 in different examples, a specific method for forming an antenna module 16 on the first surface of the plastic packaging material layer 14 comprises: forming a plurality of antenna units 161 arranged with a space from each other along a circumferential direction of the filling structure 13 on the first surface of the plastic packaging material layer 14, wherein the plurality of antenna units 161 are jointly used as the antenna module 16, wherein the antenna units 161 may be block antennas illustrated in FIG. 13 or may be spiral antennas illustrated in FIG. 14.

As an example, when the antenna units 161 are block antennas illustrated in FIG. 13, the block antennas may be metal blocks; and when the antenna units 161 are spiral antennas illustrated in FIG. 14, the spiral antennas may be formed by winding the metal wire into a spiral shape. In addition to the rectangular spiral antennas illustrated in FIG. 14, the antenna units 161 may be any other spiral antennas, such as circular spiral antennas.

Figure 15:
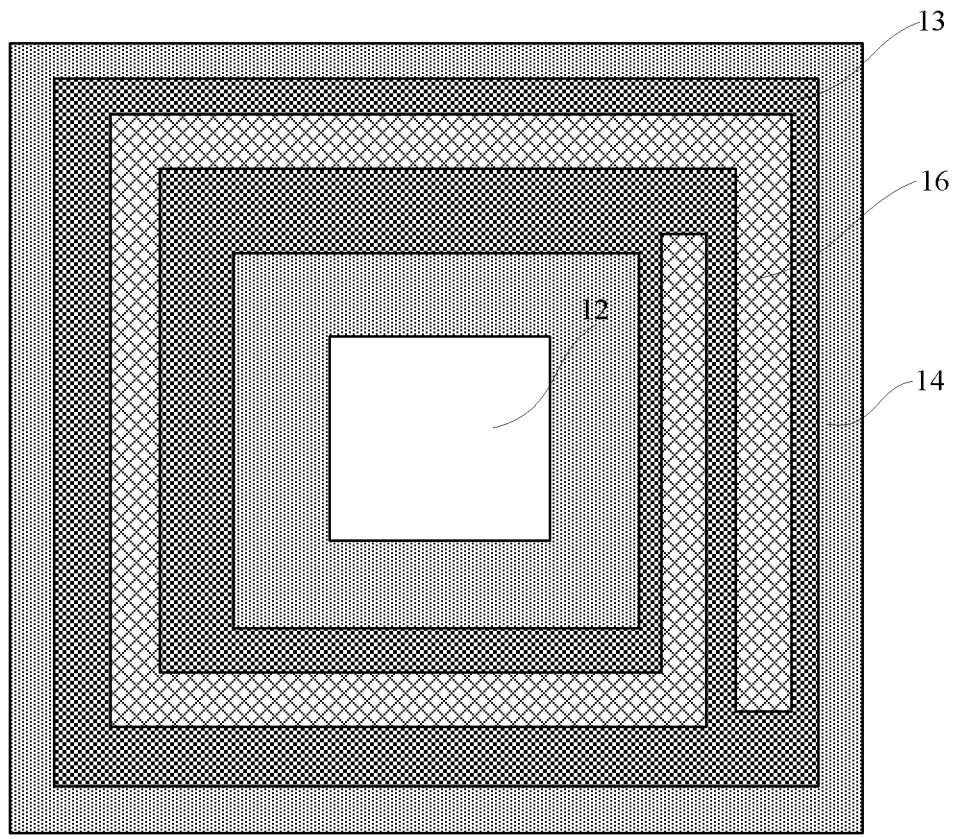

In another example, as illustrated in FIG. 15, a specific method for forming an antenna module 16 on the first surface of the plastic packaging material layer 14 comprises: forming a spiral antenna surrounding a circumferential direction of the filling structure 13 on the first surface of the plastic packaging material layer 14 as the antenna module 16, i.e., the antenna module 16 is a metal antenna which spirally surrounds the circumferential direction of the filling structure 13.

As an example, in the above-mentioned example, the material of the antenna module 16 may be, but not limited to, one or more of copper, aluminum, nickel, gold, silver, tin, and titanium; wherein the antenna module 16 may be formed by physical vapor deposition (PVD), chemical vapor deposition (CVD), sputtering, electroplating or electroless plating.

As an example, as illustrated in FIG. 12, when the interconnecting structure 18 is formed in the semiconductor packaging structure, the antenna module 16 is electrically connected with the interconnecting structure 18, i.e., the antenna module 16 is electrically connected with the redistribution layer 15 through the interconnecting structure 18.

It needs to be noted that, when the surface of the filling structure 13 is leveled with the first surface of the plastic packaging material layer 14, the antenna module 16 is formed directly on the surface of the filling structure 13.

It needs to be further noted that, in other examples, the sequence of step 6) and step 7 may be interchanged, i.e., the antenna module 16 may also be firstly formed on the first surface of the plastic packaging material layer 14, and then the redistribution layer 15 is formed on the second surface of the plastic packaging material layer 14.

Figure 16:
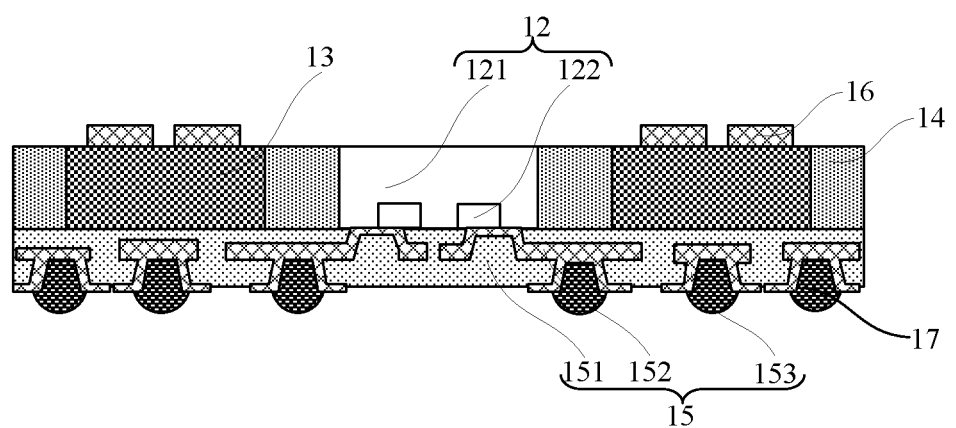
FIGS. 16-17 illustrate cross sectional views of a fan-out semiconductor packaging structure with an antenna module according to embodiments of the present disclosure.
Figure 17:
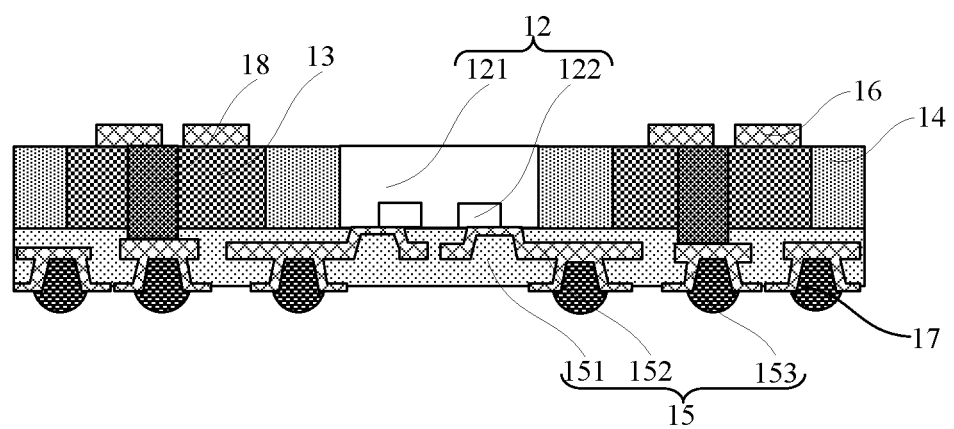

In step 8), referring to step S8 in FIG. 1 and the structures in FIGS. 16 to 17, a solder ball bump 17 is formed on a surface of the redistribution layer 15, wherein the solder ball bump 17 is electrically connected with the redistribution layer 15.

In one example, forming a solder ball bump 17 on a surface of the redistribution layer 15 comprises the following steps:
8-1) forming a metal pole (not shown) on the surface of the redistribution layer 15, wherein the metal pole is electrically connected with the metal wire layer 152 in the redistribution layer 15; and
8-2) forming a solder ball on the surface of the metal pole.

As an example, the material of the metal pole may be copper, aluminum, nickel, gold, silver, titanium, or a combination thereof, and the metal pole may be formed by adopting physical vapor deposition (PVD), chemical vapor deposition (CVD), sputtering, electroplating or electrodeless plating. The material of the sold ball may be copper, aluminum, nickel, gold, silver, titanium, or a combination thereof, and the sold ball may be formed by adopting a ball placement and reflow process.

In another example, as illustrated in FIGS. 16 and 17, the solder ball bump 17 is a solder ball, which can be directly formed as the solder ball bump 17 by adopting a ball placement and reflow process. The solder ball bump 17 is directly connected with the metal wire layer 152 in the redistribution layer 15. As an example, the height of the solder ball bump 17 may be, but not limited to, 190 μm.

The fan-out semiconductor packaging structure with the antenna module according to the present application provides the filling structure 13 in the plastic packaging material layer 14 below the antenna module 16, the loss caused by the filling structure 13 to the antenna signals is smaller than the loss caused by the plastic packaging material layer 14 to the antenna signals, which can effectively reduce the loss to the antenna signals, thus significantly improving the performance of the device.

Embodiment 2

Referring to FIG. 13 to FIG. 17, this embodiment further provides a fan-out semiconductor packaging structure with an antenna module, the fan-out semiconductor packaging structure with the antenna module may be fabricated by adopting the fabrication method in embodiment 1, and the fan-out semiconductor packaging structure with the antenna module comprises: a semiconductor chip 12; a plastic packaging material layer 14 comprising a first surface and a second surface opposite to the first surface, wherein the plastic packaging material layer 14 encloses a periphery of the semiconductor chip 12 and exposes a front surface of the semiconductor chip 12; a filling structure 13 disposed in the plastic packaging material layer 14 and disposed on the periphery of the semiconductor chip 12, a loss caused by the filling structure 13 to an antenna signal is smaller than a loss caused by the plastic packaging material layer 14 to an antenna signal; an antenna module 16 disposed on the first surface of the plastic packaging material layer 14, an orthographic projection of the antenna module 16 on the filling structure 13 is disposed on the filling structure 13; a redistribution layer 15 disposed on the second surface of the plastic packaging material layer 14, and electrically connected with the semiconductor chip 12; and a solder bump 17 disposed on a surface of the redistribution layer 15, and electrically connected with the redistribution layer 15.

As an example, the semiconductor chip 12 is a radio frequency chip. The semiconductor chip 12 comprises an unpacked chip 121 and a contact pad 122, wherein the contact pad 122 is disposed on the unpacked chip 121 and electrically connected with functional components in the unpacked chip 121; and a surface where the contact pad 122 is placed is the front surface of the semiconductor chip 12.

It needs to be noted that the semiconductor chip 12 may be any one of existing radio frequency communication chips for transmitting and receiving communication information. The thickness of the semiconductor chip 12 may be set according to actual needs. Preferably, in this embodiment, the thickness of the semiconductor chip 12 may be, but not limited to, 100 μm-200 μm.

As an example, the number of the semiconductor chips 12 may be set according to actual needs, and the number of the semiconductor chips 12 mounted on the peeling layer 11 may be one, two or more.

As an example, the material of the plastic packaging material layer 14 may be, but not limited to, a polyimide layer, a silica gel layer, an epoxy resin layer, a curable polymer-based material layer, or a curable resin-based material layer.

As an example, the first surface of the plastic packaging material layer 14 may be leveled with the back surface of the semiconductor chip 12 or/and the surface of the filling structure 13, or may be higher than the back surface of the semiconductor chip 12 or/and the surface of the filling structure 13.

As an example, the filling structure 13 may be a glass filling structure, a silicon filling structure, a Roger 5880 filling structure, a polymer material filling structure or a composite material filling structure, i.e., the material of the filling structure 13 may be glass, silicon, Roger 5880, polymer materials, composite materials, or the like.

As an example, the shape of the filling structure 13 may be set according to actual needs. Preferably, in this embodiment, the filling structure 13 may be a ring structure, the filling structure 13 surrounds the periphery of the semiconductor chip 12. The filling structure 13 may be attached to the sidewall of the semiconductor chip 12, or may have a space with the semiconductor chip 12, and preferably, in this embodiment, a space exists between the filling structure 13 and the semiconductor chip 12.

As an example, when the filling structure 13 is a ring structure, the filling structure 13 may be a circular ring structure, a rectangular ring structure or the like.

It needs to be noted that, when the filling structure 13 is a ring structure, the filling structure 13 may be a continuous ring structure or may be a ring structure comprising a plurality of filling units which are arranged with a space from each other.

As an example, the height of the filling structure 13 may be the same as the height of the semiconductor chip 12, may be smaller than the height of the semiconductor chip 12, and may also be greater than the height of the semiconductor chip 12, i.e., the top surface of the filling structure 13 may be leveled with the top surface of the semiconductor chip 12, may be lower than the top surface of the semiconductor chip 12, and may also be higher than the top surface of the semiconductor chip 12. FIG. 5 illustrates an example that the height of the filling structure 13 is the same as that of the semiconductor chip 12.

In an example, the antenna module 16 comprises a plurality of antenna units 161, and the plurality of antenna units 161 are arranged with a space from each other along a circumferential direction of the filling structure 13 on the first surface of the plastic packaging material layer 14. Specifically, the antenna units 161 may be block antennas illustrated in FIG. 13 or may be spiral antennas illustrated in FIG. 14. When the antenna units 161 are block antennas illustrated in FIG. 13, the block antennas may be metal blocks; and when the antenna units 161 are spiral antennas illustrated in FIG. 14, the spiral antennas may be formed by winding the metal wire into a spiral shape. In addition to the rectangular spiral antennas illustrated in FIG. 14, the antenna units 161 may be any other spiral antennas, such as circular spiral antennas.

In another example, as illustrated in FIG. 15, the antenna module 16 comprises a spiral antenna surrounding a circumferential direction of the filling structure, i.e., the antenna module 16 is a metal antenna which spirally surrounds the circumferential direction of the filling structure 13.

As an example, in the above-mentioned example, the material of the antenna module 16 may include, but not limited to, one or more of copper, aluminum, nickel, gold, silver, tin, and titanium; wherein the antenna module 16 may be formed by physical vapor deposition (PVD), chemical vapor deposition (CVD), sputtering, electroplating or electrodeless plating.

As an example, the redistribution layer 15 comprises: an insulating layer 151 disposed on the second surface of the plastic packaging material layer 14; at least one metal wire layer 152 disposed in the insulating layer 151; and an under-bump metal layer 153 disposed on a surface of the insulating layer 151, and electrically connected with the metal wire layer 152.

As an example, the material of the metal wire layer 152 may be, but not limited to, copper, aluminum, nickel, gold, silver, titanium, or a combination thereof, and the metal wire layer 152 may be formed by adopting a process such as PVD, CVD, sputtering, electroplating or electrodeless plating. The material of the insulating layer 121 may be a low k dielectric material. Specifically, the material of the insulating layer 151 may be one of epoxy resin, silica gel, PI, PBO, BCB, silicon oxide, phosphorosilicate glass and fluorine-containing glass, and the insulating layer 151 may be formed by adopting a process such as spin coating, CVD, plasma enhanced CVD, or the like.

As an example, as illustrated in FIG. 17, the fan-out semiconductor packaging structure with the antenna module further comprises an interconnecting structure 18, and the interconnecting structure 18 is disposed between the antenna module 16 and the redistribution layer 15, and electrically connected with the antenna module 16 and the redistribution layer 15. The material of the interconnecting structure 18 may be, but not limited to, a combination of copper, aluminum, nickel, gold, silver and titanium.

In an example, the solder ball bump 17 comprises: a metal pole disposed on the surface of the redistribution layer 15, and electrically connected with the redistribution layer 15; a solder ball disposed on a surface of the metal pole.

In another example, as illustrated in FIG. 16 and FIG. 17, the solder ball bump 17 is a solder ball.

To sum up, the present application provides the fan-out semiconductor packaging structure with the antenna module and the method making the same. The fan-out semiconductor packaging structure with the antenna module comprises: the semiconductor chip; the plastic packaging material layer comprising the first surface and the second surface opposite to the first surface, wherein the plastic packaging material layer encloses the periphery of the semiconductor chip and exposes the front surface of the semiconductor chip; the filling structure disposed in the plastic packaging material layer and disposed on the periphery of the semiconductor chip, the loss caused by the filling structure to antenna signals is smaller than the loss caused by the plastic packaging material layer to antenna signals; the antenna module disposed on the first surface of the plastic packaging material layer, the orthographic projection of the antenna module on the filling structure is disposed on the filling structure; the redistribution layer disposed on the second surface of the plastic packaging material layer, and electrically connected with the semiconductor chip; and the solder bump disposed on the surface of the redistribution layer, and electrically connected with the redistribution layer. The fan-out semiconductor packaging structure with the antenna module according to the present application provides the filling structure in the plastic packaging material layer below the antenna module, the loss caused by the filling structure to the antenna signals is smaller than the loss caused by the plastic packaging material layer to the antenna signals, which can effectively reduce the loss to the antenna signals, thus significantly improving the performance of the device.

The above-mentioned embodiments are only used for exemplarily describing the principle and effects of the present application instead of limiting the present application. One skilled in the art may make modifications or changes to the above-mentioned embodiments without departing from the spirit and scope of the present application. Therefore, all equivalent modifications or changes made by those who have common knowledge in the art without departing from the spirit and technical thought disclosed by the present application shall be still covered by the claims of the present application.

The invention claimed is:

1. A fan-out semiconductor packaging structure with an antenna module, comprising:
　　a semiconductor chip;
　　a plastic packaging material layer comprising a first surface and a second surface opposite to the first surface, wherein the plastic packaging material layer is patterned to enclose a periphery of the semiconductor chip and exposes a front surface of the semiconductor chip;
　　a filling structure patterned inside the plastic packaging material layer, wherein the filling structure is made of a material matching an antenna signal better than a material of the plastic packaging layer, such that a loss caused by the filling structure to the antenna signal is smaller than a loss caused by the plastic packaging material layer to the antenna signal;
　　wherein a top surface of the filling structure, the first surface of the plastic packaging material layer, and the front surface of the semiconductor chip are arranged in a same plane;
　　an antenna module disposed directly on the top surface of the filling structure;
　　a redistribution layer disposed on the second surface of the plastic packaging material layer, and electrically connecting with the semiconductor chip; and
　　a solder bump disposed on a surface of the redistribution layer, and electrically connecting with the redistribution layer.

2. The fan-out semiconductor packaging structure with the antenna module according to claim 1, wherein the semiconductor chip is unpackaged and comprises:
　　a contact pad disposed on the front surface of the semiconductor chip connecting electrically with the unpackaged chip.

3. The fan-out semiconductor packaging structure with the antenna module according to claim 1, wherein the filling structure comprises a glass filling structure, a silicon filling structure, a Roger 5880 filling structure, a polymer material filling structure or a composite material filling structure.

4. The fan-out semiconductor packaging structure with the antenna module according to claim 1, wherein the filling structure is a ring structure, wherein the filling structure surround the periphery of the semiconductor chip, and has a space from the semiconductor chip.

5. The fan-out semiconductor packaging structure with the antenna module according to claim 4, wherein the antenna module comprises a plurality of antenna units, wherein the plurality of antenna units are arranged with a space from each other along a circumferential direction of the filling structure on the first surface of the plastic packaging material layer.

6. The fan-out semiconductor packaging structure with the antenna module according to claim 5, wherein the plurality of antenna units each is a block antenna or a spiral antenna.

7. The fan-out semiconductor packaging structure with the antenna module according to claim 4, wherein the antenna module comprises a spiral antenna surrounding a circumferential direction of the filling structure.

8. The fan-out semiconductor packaging structure with the antenna module according to claim 1, further comprising an interconnecting structure, wherein the interconnecting structure is disposed between the antenna module and the redistribution layer, and is electrically connected with the antenna module and the redistribution layer.

9. The fan-out semiconductor packaging structure with the antenna module according to claim 1, wherein the redistribution layer comprises:
　　an insulating layer disposed on the second surface of the plastic packaging material layer;
　　at least one metal wire layer disposed in the insulating layer; and
　　an under-bump metal layer disposed on a surface of the insulating layer, and electrically connecting with the metal wire layer.

10. A method for fabricating a fan-out semiconductor packaging structure with an antenna module, comprising the following steps:
　　1) providing a carrier and forming a peeling layer on a top surface of the carrier;
　　2) providing a semiconductor chip and mounting the semiconductor chip on a surface of the peeling layer with a front surface facing downward;
　　3) providing a filling structure on the surface of the peeling layer, wherein the filling structure is disposed at a periphery of the semiconductor chip;
　　4) forming a plastic packaging material layer on the surface of the peeling layer, wherein the plastic packaging material layer encloses the semiconductor chip and the filling structure; further planarizing the plastic packaging material layer to form a first surface and a second surface opposite to the first surface, wherein the first surface of the plastic packaging material layer, a top surface of the filling structure, and the front surface of the semiconductor chip are arranged in a same plane, and wherein the second surface of the plastic packaging material layer is in contact with the peeling layer; and wherein a material of the filling structure matches an antenna signal better than the plastic packaging material does such that a loss caused by the filling structures to the antenna signal is smaller than a loss caused by the plastic packaging material layer to the antenna signal;
　　5) removing the carrier and the peeling layer;
　　6) forming a redistribution layer on the second surface of the plastic packaging material layer, wherein the redistribution layer is electrically connected with the semiconductor chip;
　　7) forming an antenna module in direct contact with the top surface of the filling structure; and
　　8) forming a solder ball bump on a surface of the redistribution layer, wherein the solder ball bump is electrically connected with the redistribution layer.

11. The method for fabricating the fan-out semiconductor packaging structure with the antenna module according to claim 10, wherein the filling structure provided in step 3) comprises a glass filling structure, a silicon filling structure, a Roger 5880 filling structure, a polymer material filling structure or a composite material filling structure.

12. The method for fabricating the fan-out semiconductor packaging structure with the antenna module according to claim 10, wherein the filling structure provided in step 3) is a ring structure, wherein the filling structure surrounds the periphery of the semiconductor chip, and has a space from the semiconductor chip.

13. The method for fabricating the fan-out semiconductor packaging structure with the antenna module according to claim 10, wherein, in step 7), forming the antenna module on the top surface of the filling structure comprises:
　　forming a plurality of antenna units arranged with a space from each other along a circumferential direction of the filling structure, wherein the plurality of antenna units are jointly used as the antenna module, and wherein the antenna units comprise block antennas or spiral antennas.

14. The method for fabricating the fan-out semiconductor packaging structure with the antenna module according to claim 10, wherein, in step 7), forming the antenna module in direct contact with the top surface of the filling structure comprises:

forming a spiral antenna surrounding a circumferential direction of the filling structure as the antenna module.

15. The method for fabricating the fan-out semiconductor packaging structure with the antenna module according to claim 10, further comprising the following step between step 6) and step 7): forming an interconnecting structure running through the filling structure and the plastic packaging material layer, wherein the interconnecting structure is electrically connected with the redistribution layer; and wherein the antenna formed in step 7) is electrically connected with the interconnecting structure.

* * * * *